United States Patent [19]

Inoue et al.

[11] Patent Number: 6,137,207
[45] Date of Patent: Oct. 24, 2000

[54] SURFACE ACOUSTIC WAVE DEVICE CONTAINING AN INTERDIGITAL ELECTRODE ON A SINGLE CRYSTAL SUBSTRATE

[75] Inventors: Kenji Inoue; Katsuo Sato, both of Tokyo, Japan

[73] Assignee: TDK Corporation, Tokyo, Japan

[21] Appl. No.: 09/303,537

[22] Filed: May 3, 1999

Related U.S. Application Data

[63] Continuation of application No. PCT/JP98/02767, Jun. 22, 1998.

[30] Foreign Application Priority Data

Sep. 2, 1997 [JP] Japan ..................... 9-237118

[51] Int. Cl.$^7$ .................................. H01L 41/08
[52] U.S. Cl. ...................... 310/313 A; 310/360
[58] Field of Search ................. 310/313 A, 313 B, 310/313 R, 348, 360

[56] References Cited

U.S. PATENT DOCUMENTS

| | | | |
|---|---|---|---|
| 4,672,255 | 6/1987 | Suzuki et al. | 310/313 A |
| 4,902,926 | 2/1990 | Engel et al. | 310/361 |
| 5,821,673 | 10/1998 | Pisarevsky et al. | 310/360 |
| 5,917,265 | 6/1999 | Naumenko et al. | 310/313 A |

*Primary Examiner*—Mark O. Budd
*Attorney, Agent, or Firm*—Oblon, Spivak, McClelland, Maier & Neustadt, P.C.

[57] ABSTRACT

The present invention provides a small yet wide-passband surface acoustic wave device that is excellent in selectivity, i.e., temperature characteristics. The surface acoustic wave device contains an interdigital electrode on the surface of a substrate made up of a langasite single crystal having the formula, $La_3Ga_5SiO_{14}$, and belonging to a point group 32. When the cut angle of the substrate cut out of the langasite single crystal and the direction of propagation of a surface acoustic wave on the substrate are represented in terms of Euler's angles ($\phi$, $\theta$, and $\psi$), $\phi$, 74 and $\psi$ are found within areas represented by $\phi=-5$ to 5, $\theta=136$ to 146−, and $\psi=21$ to 30, respectively. The relationship between the normalized thickness h/λ (%) where the thickness, h, of the interdigital electrode is normalized with the wavelength λ of a surface acoustic wave and the above $\psi$ (degree) indicating the direction of propagation of the surface acoustic wave is given by $$-3.79\,(h/\lambda)+23.86 \leq \psi \leq -5.08\,(h/\lambda)+26.96$$

when $\psi \leq 25.5$, and
the above relationship is given by $$4.39(h/\lambda)+24.30 \leq \psi \leq 3.54\,(h/\lambda)+27.17$$

when $\psi > 25.5$.

9 Claims, 4 Drawing Sheets

$\psi = 22°$

● NORMALIZED 0.5% THICKNESS
☒ NORMALIZED 0.75% THICKNESS $h/\lambda = 0.75\%$

● $\psi = 30°$
△ $\psi = 22°$

SURFACE ACOUSTIC WAVE DEVICE CONTAINING AN INTERDIGITAL ELECTRODE ON A SINGLE CRYSTAL SUBSTRATE

This application is a Continuation of international application PCT/JP98/02767, filed on Jun. 22, 1998.

BACKGROUND OF THE INVENTION

1. Field of the Invention

The present invention relates to a surface acoustic wave device containing an interdigital electrode on a single crystal substrate.

2. Description of the Background

In recent years, mobile communication terminal equipment inclusive of cellular telephones has been rapidly popularized. It is highly desirable to reduce this terminal equipment in size and weight for enhanced portability. To achieve size and weight reductions for the terminal equipment, electronic parts used therewith, too, must be essentially reduced in size and weight. For this reason, surface acoustic wave devices favorable for size and weight reductions, i.e., surface acoustic wave filters, are often used for high- and intermediate-frequency parts of the terminal equipment. A surface acoustic wave device has on the surface of a piezoelectric substrate an interdigital electrode for exciting, receiving, reflecting, and propagating surface acoustic waves.

Among characteristics important to a piezoelectric substrate used for surface acoustic wave devices, are the surface wave velocity of surface acoustic waves (SAW velocity), the temperature coefficient of a center frequency in the case of filters and of a resonance frequency in the case of resonators (the temperature coefficient of frequency: TCF), and an electromechanical coupling factor ($k^2$). The characteristics of various piezoelectric substrates currently known for surface acoustic wave devices are set forth below in Table 1.

64LN, and 36LT. Also, wide passband widths of 20 MHz or more are required for filters used on high-frequency parts. To achieve such wide passbands, however, it is essentially required that piezoelectric substrates have a large electromechanical coupling factor $k^2$. For these reasons, much use is made of 64LN, and 36LT.

On the other hand, a frequency band of 70 to 300 MHz is used as an intermediate frequency for mobile terminal equipment. When a filter having a center frequency in this frequency band is constructed with the use of a surface acoustic wave device, the use of the aforesaid 64LN or 36LT as a piezoelectric substrate causes the widths of electrode fingers formed on the substrate to be much larger than those of the aforesaid filter used for a high-frequency part.

This is now explained with reference to roughly calculated values. Here let d represent the width of an electrode finger of a surface acoustic wave transducer that forms a surface acoustic wave filter, $f_0$ indicate the center frequency of the surface acoustic wave filter, and V denote the SAW velocity of the piezoelectric substrate used. For these values, equation (1) then holds roughly:

$$f_0 = V/(4d) \qquad (1)$$

If a surface acoustic wave filter having a center frequency of 1 GHz is constructed on the assumption that the SAW velocity is 4,000 m/s, then the width of its electrode finger is calculated from equation (1) to be $$d = 4,000 (m/s)/(4 \times 1,000 \ (MHz)) = 1(\mu m)$$

On the other hand, when an intermediate-frequency filter having a center frequency of 100 MHz is constructed using this piezoelectric substrate having an SAW velocity of 4,000 m/s, the electrode finger width required for this is given by $$d = 4,000 \ (m/s)/(4 \times 100 \ (MHz)) = 10(\mu m)$$

Thus, the required electrode finger width is 10 times as large as that for the high-frequency part filter. A large electrode

TABLE 1

| Symbol | Composition | Cut Angle | Propagation Direction | SAW Velocity (m/s) | $k^2$ (%) | TCF (ppm/°) |
|---|---|---|---|---|---|---|
| 128LN | LiNbO$_3$ | 128°-Rotated Y | X | 3992 | 5.5 | −74 |
| 64LN | LiNbO$_3$ | 64°-Rotated Y | X | 4742 | 11.3 | −79 |
| LT112 | LiTaO$_3$ | X | 112°-Rotated Y | 3288 | 0.64 | −18 |
| 36LT | LiTaO$_3$ | 36°-Rotated Y | X | 4212 | 4.7 | −45 |
| ST Quartz Crystal | Quartz Crystal | ST | X | 3158 | 0.14 | 0 (first-order coeff.) |
| BGO | Bi$_{12}$GeO$_{20}$ | (100) | (011) | 1681 | 1.2 | −122 |

As may be seen from Table 1, 64LN and 36LT have an SAW velocity of 4,000 m/s or higher, and are, thus, suitable to construct filters for high-frequency parts of terminal equipment. This is because various systems are practically employed for mobile communications represented by cellular telephones all over the world, and are all used at frequencies of the order of 1 GHz. Accordingly, filters used for high-frequency parts of terminal equipment have a center frequency of approximately 1 GHz. Surface acoustic wave filters have a center frequency substantially proportional to the SAW velocities of piezoelectric substrates used and almost inversely proportional to the widths of electrode fingers formed on the substrates. To enable such filters to be operated at high frequencies, therefore, it is preferable to resort to substrates having high SAW velocities, for instance, finger width implies that a surface acoustic wave device itself becomes large. To make a surface acoustic wave intermediate-frequency filter small, therefore, it is necessary to use a piezoelectric substrate having a low SAW velocity V, as can be appreciated from equation (1).

Among piezoelectric substrates known to have a very low SAW velocity, there is also ST quartz crystal BGO such as one already referred to in Table 1. A BGO piezoelectric substrate has an SAW velocity of 1,681 m/s. However, the BGO piezoelectric substrate is unsuitable to construct an intermediate-frequency filter for extracting one channel signal alone, because its temperature coefficient of frequency or its TCF is as large as −122 ppm/°C. This is because a large TCF value implies that the center frequency of the surface acoustic wave filter varies largely with temperature. Thus, large TCF is unsuitable for an intermediate-frequency filter because undesired signals may possibly be extracted from other channel adjacent to the desired channel.

Among piezoelectric substrates known to have a relatively low SAW velocity, there is also ST quartz crystal such as one referred to in Table 1. The ST quartz crystal is suitable to construct an intermediate-frequency filter because its temperature coefficient of frequency or its TCF is almost zero (with a first-order temperature coefficient a of zero). For this reason, most of intermediate-frequency surface acoustic wave filters used so far for mobile communication terminal equipment are constructed of ST quartz crystal piezoelectric substrates. However, the SAW velocity of the ST quartz crystal substrate is 3,158 m/s or is not on a sufficiently reduced level, and so presents some limitation to size reductions. In addition, the electromechanical coupling factor $k^2$ of the ST quartz crystal is 0.14%, and so is relatively small. Small $k^2$ implies that only a filter having a narrow passband is achievable. Adopted mainly so far for mobile communications, that is, cellular telephones, are analog systems with a very narrow channel width of, for instance, 12.5 kHz according to the Japanese NTT standard, 30 kHz according to the U.S. AMPS standard, and 25 kHz according to the European TACS standard. Thus, the fact that the aforesaid ST quartz crystal has a small electromechanical coupling factor $k^2$ has offered no problem whatsoever. In recent years, however, digital mobile communication systems have been developed, put to practical use, and so rapidly widespread in view of making effective use of frequency resources, compatibility with digital data communications, etc. The channel width of this digital system is very wide, for instance, 200 kHz and 1.7 MHz in the European cellular telephone GSM and cordless telephone DECT modes, respectively. If ST quartz crystal substrates are used for surface acoustic wave filters, it is then difficult to construct such wideband intermediate-frequency filters using them.

As explained above, a problem with conventional surface acoustic wave devices is that when a piezoelectric substrate having a large electromechanical coupling factor, e.g., 64LN or 36LT is used, it is possible to make its passband wide, but the device size becomes large because that substrate has a high SAW velocity. Another problem occurring is that when the aforesaid BGO substrate having a low SAW velocity is used to achieve device size reductions, adequate selectivity is not obtained due to the large absolute value of the temperature coefficient of frequency, TCF. In either case, adequate characteristics for an intermediate-frequency surface acoustic wave filter are unachievable.

The ST quartz crystal substrate having a small temperature coefficient of frequency or TCF presents some limitation to size reductions due to the fact that its SAW velocity is not sufficiently reduced, and makes it difficult to achieve wide band due to the fact that its electromechanical coupling factor $k^2$ is relatively small.

SUMMARY OF THE INVENTION

Accordingly, it is an object of the present invention to provide a small yet wide-passband surface acoustic wave device which is excellent selectivity or temperature characteristics.

The above objects and others are provided by a surface acoustic wave device containing an inter-digital electrode on a surface of a substrate, wherein:

the substrate is made up of a langasite single crystal having the formula, $La_3Ga_5SiO_{14}$, and belonging to a point group 32, when a cut angle of said substrate cut out of the langasite single crystal and a direction of propagation of surface acoustic waves on said substrate are represented in terms of Euler's angles (φ, θ, ψ) φ, θ and ψ are found within areas represented by φ=−5 to 5°, θ=136 to 146°, and ψ=21 to 30°, respectively; and when ψ≦25.5°, a relationship between a normalized thickness h/λ (%) where a thickness, h, of said interdigital electrode is normalized with a wavelength λ of a surface acoustic wave and said ψ (°) indicating the direction of propagation of the surface acoustic wave is given by −3.79 (h/λ)+23.86≦ψ≦−5.08(h/λ)+26.96 and when ψ>25.5°, said relationship is given by 4.39(h/λ)+24.30≦ψ≦3.54(h/λ)+27.17

DETAILED DESCRIPTION OF THE PREFERRED EMBODIMENTS

The present invention is predicated upon the surprising discovery that a certain langasite single crystal has a specifically combined cut angle and direction of propagation of surface acoustic waves, where the temperature dependence of the center frequency of a filter containing the langasite single crystal or of the resonance frequency of a resonator containing the langasite single crystal can be approximated by a quadratic curve, and such properties as expressed in terms of an SAW velocity of less than 3,000 m/s, and an electromechanical coupling factor of greater than 0.3% are obtained. This specific combination may be represented by the above angle ranges of φ, θ and ψ in terms of Euler's angles (φ, θ and ψ). It has also been discovered that in this specific combination, the temperature corresponding to the peak of the quadratic curve, i.e., the temperature at which the change of the center or resonance frequency is minimized, correlates with the direction of propagation of surface acoustic waves (r in Euler's angle expression) and the normalized thickness (h/λ) of the interdigital electrode Here h is the thickness of the interdigital electrode and λ is the wavelength of a surface acoustic wave at the center or resonance frequency. On the basis of these findings, the present inventors have adjusted the temperature corresponding to the above peak in the vicinity of room temperature, for instance, in the range of 10° C. to 40° C. by allowing ψ and h/λ to satisfy the above specific relation, thereby succeeding in the surprising achievement of a small yet wide-passband surface acoustic wave device which shows an excellent temperature stability at an ambient temperature at which it is used.

Figure 1:
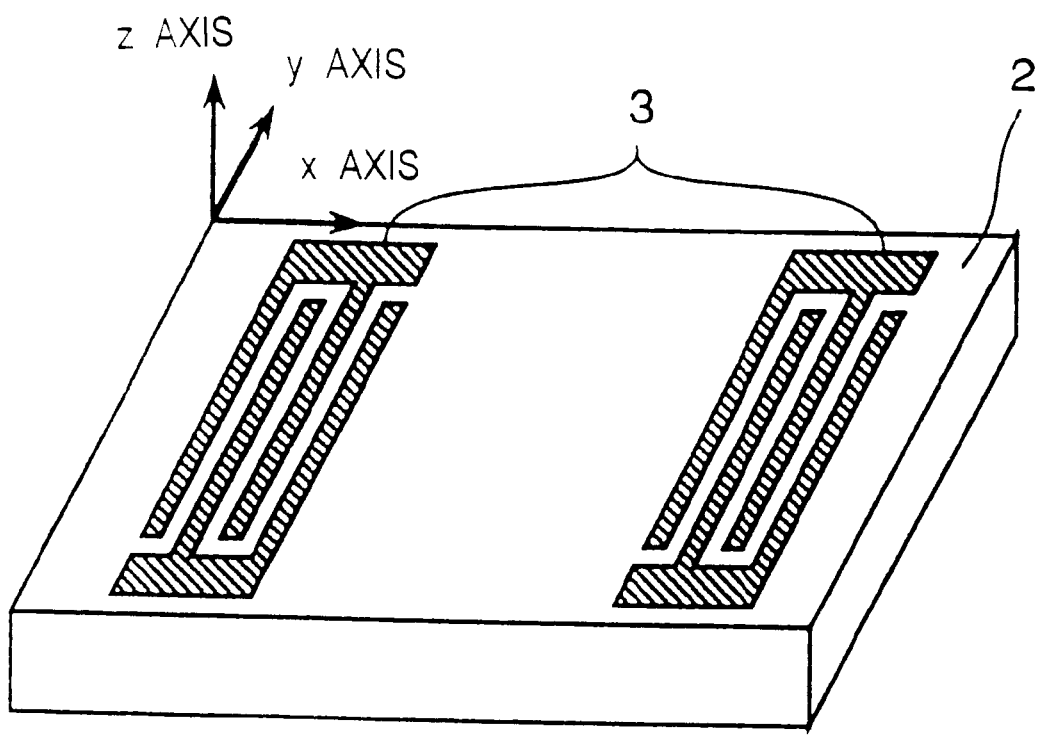
FIG. 1 is a perspective view of a typical embodiment of the surface acoustic wave device according to the present invention.

FIG. 1 illustrates a typical embodiment of the surface acoustic wave device according to invention. This surface acoustic wave device comprises on the surface of a substrate 2 a set of interdigital electrodes 3 and 3 for exciting, receiving, reflecting, and propagating surface acoustic waves. For the substrate 2 a langasite single crystal is used. The langasite single crystal is a crystal type belonging to a point group 32. In FIG. 1, x, y, and z axes are perpendicular to one another. The x, and y axes lie in the surface plane of the substrate 2, and the x axis defines the direction of propagation of surface acoustic waves. The z axis perpendicular to the substrate plane defines a cut angle (cut plane) of the substrate cut out of the single crystal. Relationships between these x, y and z axes and the X, Y and Z axes of the langasite single crystal may be represented in terms of Euler's angles (φ, θ and ψ). When, in the surface acoustic wave device according to the invention, the cut angle and the propagation direction are represented in terms of Euler's angles (ψ, θ, ψ), φ, θ and ψ exist in areas represented by φ=−5 to 5°

θ=136 to 146°

ψ=21 to 30°

In this area the temperature dependence of frequency assumes on a quadratic curve form. When this curve is approximated by the least squares method to a linear line, it is found that there is a combination of φ, θ and ψ wherein the temperature coefficient of frequency, TCF, of the substrate is very small or lies within ±1 ppm/°C., and the coupling factor $k^2$ of the substrate is sufficiently large or at least 0.3%.

It is to be noted that the langasite single crystal is a trigonal system, and so mutually equivalent combinations of Euler's angles exist due to crystal symmetry. In the trigonal system substrate, φ=120 to 240°, and φ=240 to 360° (−120 to 0°) are equivalent to φ=0 to 120°; θ=360 to 180° (0 to −180) is equivalent to θ=0 to 180°; and ψ=90 to 270° is equivalent to ψ=−90 to 90°. In the present invention, similar effects are also obtainable with angles that are not shown in the following example but are crystallographically equivalent to those referred to herein.

Set out below are exemplary equivalent combinations. Equivalent to (0°, 140°, 25°) are (60°, 40°, 25°), (60°, 40°, −25°), (120°, 140°, −25°), and (120°, 140°, 25). Since φ=120° is equivalent to φ=0°, (0°, 140°, −25-), too, is equivalent to (0°, 140°, 25°).

An account is now given of why ψ that defines the direction of propagation of surface acoustic waves and the normalized thickness, h/λ, of the interdigital electrode are determined such that they satisfy the above relationship.

A langasite single crystal was grown by the CZ process, and a substrate was cut out of this single crystal. A surface acoustic wave transducer comprising a set of interdigital electrodes was formed on the surface of the substrate to fabricate a surface acoustic wave device. The interdigital electrodes were formed on both output and input sides by vacuum evaporation of Al, and had an electrode finger width d of 10 μm and an electrode finger pitch (4d=λ) of 40 μm, with the number of electrode finger pairs being 20. The electrode thickness (normalized thickness) was 0.3% (0.12 μm), 0.5% (0.20 μm) or 0.75% (0.30 μm). The cut angle of the substrate was (O, 140°, ψ) in terms of Euler's angles. This cut angle is a so-called single rotation where only one crystal rotation is needed for cutting, and so is preferable. Data about this (0°, 140°, ψ) substrate are set out below so as to explain the usefulness of the present invention.

Figure 2:
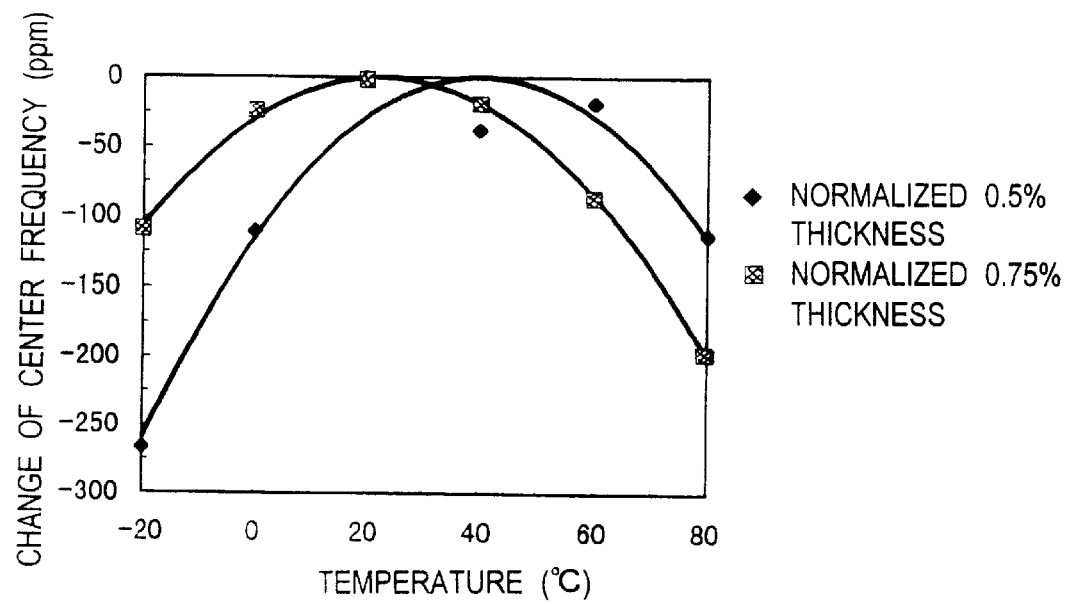
FIG. 2 is a graph illustrating a difference in the temperature dependence of center frequency changes between inter-digital electrodes having varying normalized thicknesses.
Figure 3:
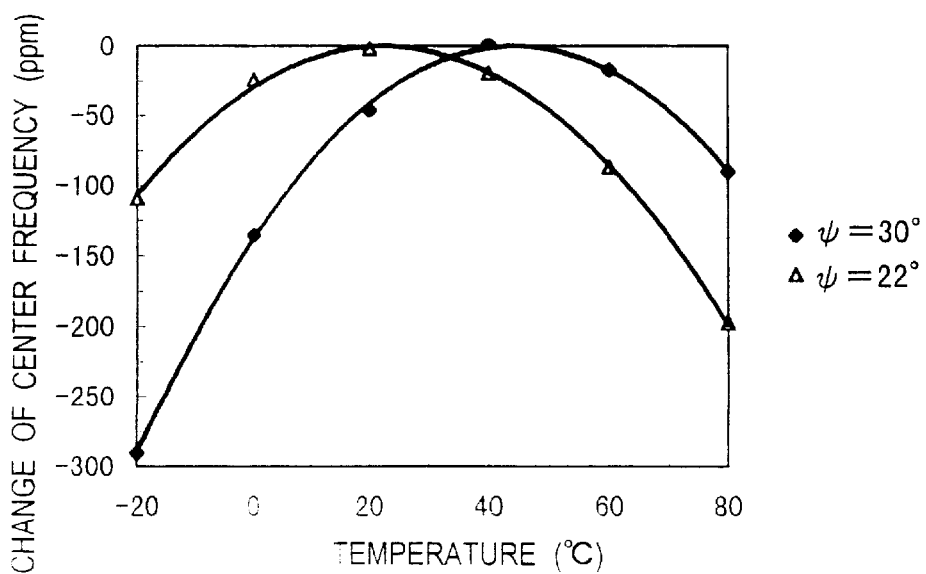
FIG. 3 is a graph illustrating a difference in the temperature dependence of center frequency changes between varying directions of propagation of surface acoustic waves.

FIG. 2 illustrates the temperature dependence of the center frequency of the surface acoustic wave device (the surface acoustic wave filter) fabricated by the above process. In the surface acoustic wave device shown in FIG. 2, the propagation direction was ψ=22° in terms of Euler's angles and the normalized thickness h/λ was 0.5% or 0.75%. From FIG. 2, it is understood that the temperature dependence of the center frequency can be well approximated by a quadratic curve, and the peak temperature of this quadratic curve changes depending on the normalized thickness h/λ. When the direction ψ of propagation of surface acoustic waves changes while the normalized thickness h/λ is fixed, too, the peak temperature of the quadratic curve shifts. This is typically shown in FIG. 3. FIG. 3 shows an example where ψ=22° or ψ=30° with the normalized thickness h/λ fixed at 0.75%. From theses, the inventors have arrived at an idea that the temperature stability of a surface acoustic wave device could be improved by selecting the direction of propagation of surface acoustic waves depending on the normalized thickness of the electrode, and setting the peak temperature in the vicinity of room temperature. It is here to be noted that the changes of the center frequency in FIGS. 2 and 3 were calculated from $$(f-f_0)/f_0$$

where $f_0$ is the maximum value of the center frequency (the center frequency at the peak temperature) and f is the center frequency at any arbitrary temperature.

Figure 4:
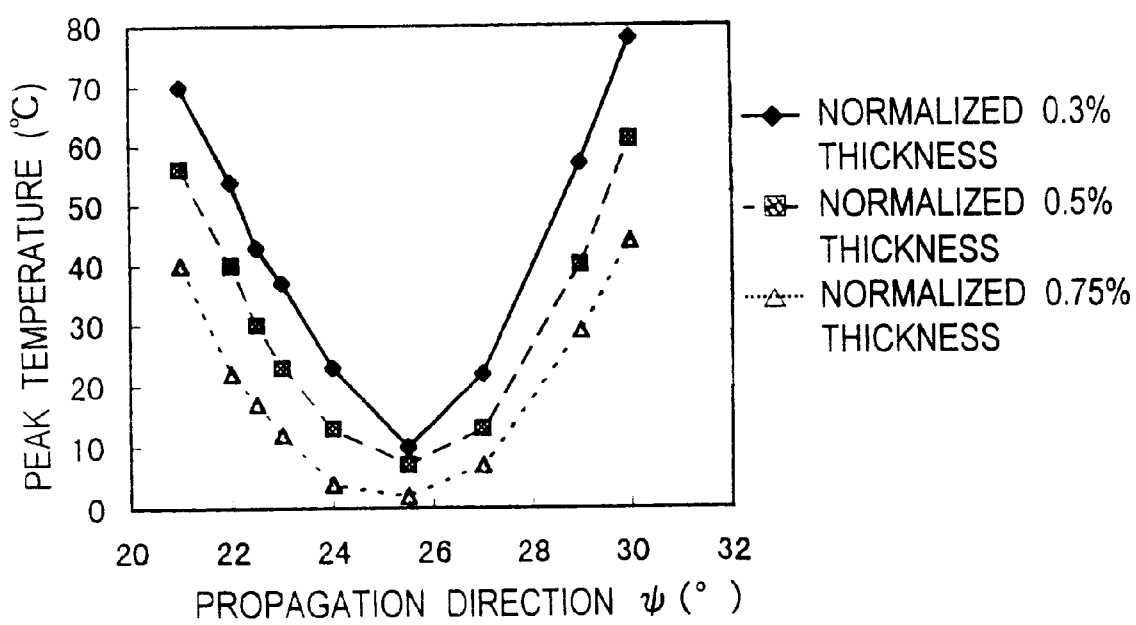
FIG. 4 is a graph illustrating the relationship between the direction of propagation of surface acoustic waves and the peak temperature at each normalized thickness.

As shown in FIGS. 2 and 3, the temperature dependence of the center frequency change was approximated by the quadratic curve to find the peak (turnover) temperature of the quadratic curve, thereby investigating the relationships between the peak temperature, and the propagation direction ψ and normalized thickness h/λ. The results are plotted in FIG. 4. FIG. 4 shows propagation direction ψ vs. peak temperature relationships at the normalized thickness of 0.3%, 0.5%, and 0.75%, respectively. From FIG. 4, it is understood that in the process of transition of the propagation direction from 25 degrees to 26 degrees (or at 25.5 degrees), there is a peak temperature decrease with increasing 1 in an area having a small ψ, and there is a peak temperature increases with increasing ψ in an area having a large ψ.

Figure 5A:
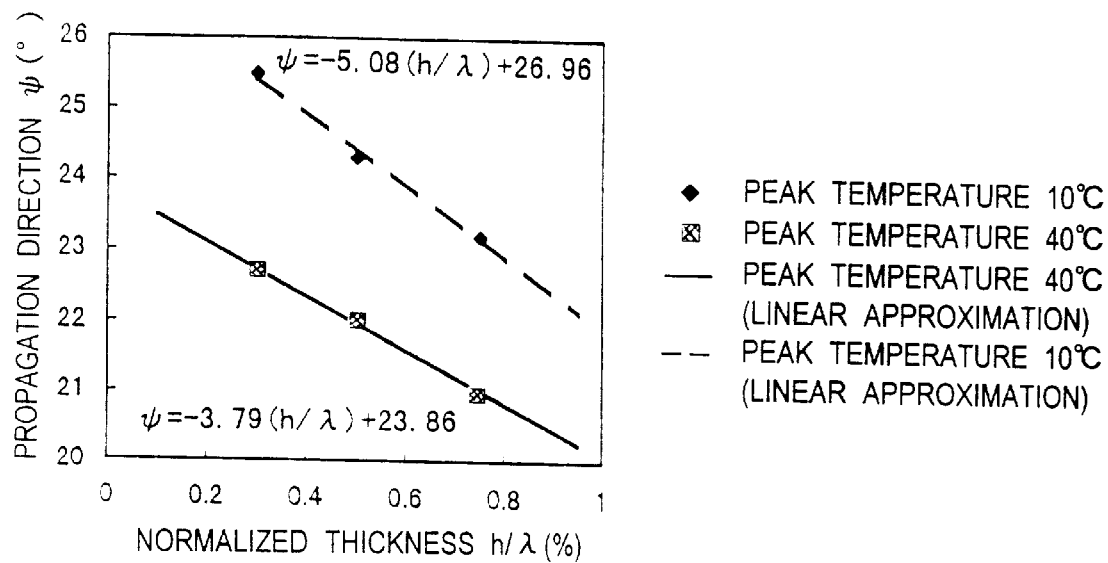
FIG. 5A is a graph illustrating the relationship between the normalized thickness and the propagation direction when the propagation direction is ψ≦25.5°, which relationship ensures that the peak temperature is in the range of 10 to 40° C.
Figure 5B:
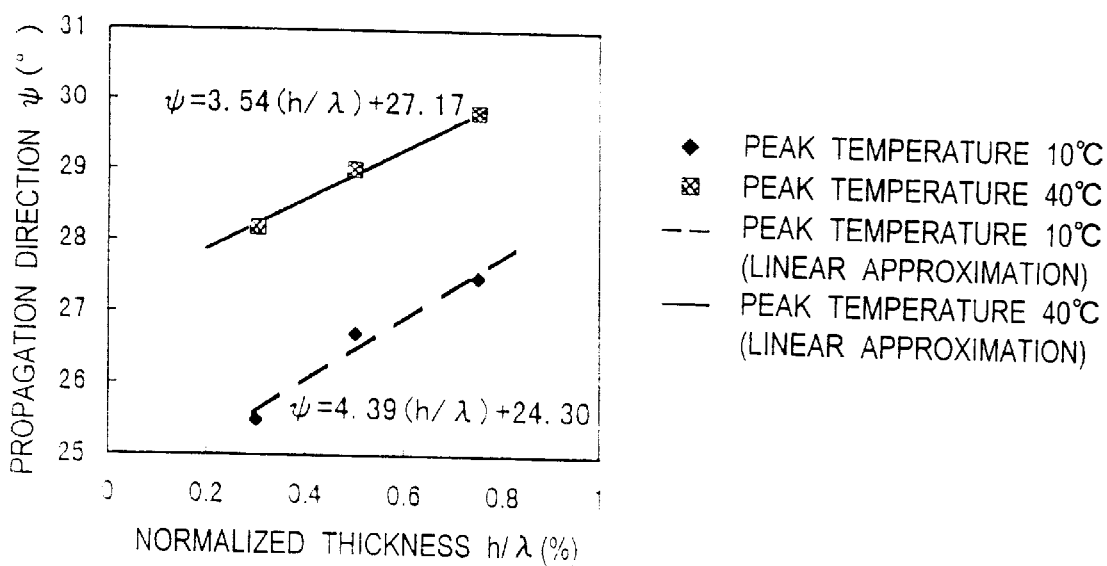
FIG. 5B is a graph illustrating the relationship between the normalized thickness and the propagation direction when the propagation direction is ψ>25.5°, which relationship ensures that the peak temperature is in the range of 10 to 40° C.

In view of the temperature stability of the device, it is desired that the above peak temperature exist in the vicinity of room temperature (usually about 25° C.), i.e., in the range of 10 to 40° C. For this reason, the normalized thickness h/λ vs. propagation direction relationship where the peak temperature of 10° C., and 40° C., respectively, was obtained was found from FIG. 4. At a propagation direction ψ equal to or less than 25.5 degrees the results shown in FIG. 5A was obtained, and at a propagation direction ψ greater than 25.5 degrees the results shown in FIG. 5B were obtained. In other words, the h/λ vs. ψ relation defined herein is obtained. By setting the propagation direction ψ in the area ranges sandwiched between the upper and lower straight lines in FIGS. 5A and 5B, the peak temperature for the frequency temperature characteristics can thus be set in the vicinity of room temperature, thereby achieving a device excellent in temperature stability.

It is to be noted that the wavelength λ of a surface acoustic wave at the center or resonance frequency is determined by the frequency to which the surface acoustic wave device is applied and the speed of sound of the substrate. In the preferred frequency band to which the invention is applied, however, the wavelength λ is generally of the order of 8 to 60 μm. It is also to be noted that the thickness, h, of the interdigital electrode is generally of the order of 0.1 to 2 μm, because too thin an electrode results in increased electrical resistance while too thick an electrode is difficult to form, and is likely to exfoliate. Accordingly, the normalized thickness h/λ of the interdigital electrode is generally of the order of 0.17 to 25%. It is understood, however, that 2.40%, and 3.38% are upper limits to h/λ because the upper and lower straight lines intersect at h/λ=2.40% in FIG. 5A, and at h/λ=3.3~3% in FIG. 5B, respectively.

The langasite single crystal used in the present invention is generally represented by the chemical formula $La_3Ga_5SiO_{14}$. A langasite single crystal, for instance, is known from Proc. IEEE International Frequency Control Sympo. vol. 1994, pp. 48–57(1994). In the invention, the langasite single crystal is applied to a surface acoustic wave device substrate. If, in this case, the crystal cut direction is selected as mentioned above and the direction of propagation of surface acoustic waves is selected depending on the normalized thickness of the interdigital electrode, then a surface acoustic wave device having such high characteristics as mentioned above can be achieved. In this regard, the present invention is readily distinguishable from the conventional use of langasite single crystals.

Langasite single crystals, if they are found by x-ray diffraction to be mainly composed of a langasite phase alone, may be used herein. In other words, the langasite single crystals used herein are not always limited to that represented by the aforesaid chemical formula. For instance, at least one part of each site for La, Ga, and Si may have been substituted by other element, or the number of oxygen atoms may depart from the aforesaid stoichiometric composition. In addition, the langasite single crystals may contain inevitable impurities such as Al, Zr, Fe, Ce, Nd, Pt, and Ca. No particular limitation is imposed on how to produce the langasite single crystals; that is, they may be produced by ordinary single crystal growth processes, for instance, the CZ process.

Substrate size is not particularly critical, and may generally be of the order of 4 to 10 mm in the direction of propagation of surface acoustic waves and of the order of 2 to 4 mm in the direction perpendicular thereto, and substrate thickness may be of the order of 0.2 to 0.4 mm. It is to be noted that the cut direction of the substrate is ascertainable by x-ray diffraction. Each of the interdigital electrodes 3 formed on the substrate 2 is a periodically striped electrode. The interdigital electrode is such patterned as to achieve the aforesaid preselected direction of propagation of surface acoustic waves depending on its thickness. The interdigital electrode may be formed as by vacuum evaporation or sputtering, using Al or Al alloys. The finger width of the interdigital electrode may be determined depending on the frequency to which the surface acoustic wave device is applied and the speed of sound of the substrate, and may generally be of the order of 2 to 15 μm at the frequency band to which the invention is preferably applied.

The surface acoustic wave device of the invention lends itself well to filters used at a frequency band of 10 to 500 MHz in general, and 10 to 300 MHz in particular. The surface acoustic wave device of the invention is useful for making a surface acoustic wave delay element small as well, because of its low SAW velocity.

Thus, in accordance with the present invention, where the cut angle of the langasite single crystal substrate is adjusted, it is surprisingly possible to achieve a surface acoustic wave device containing a substrate having a large electromechanical coupling factor $k^2$ and a slow SAW velocity. By appropriately selecting the direction of propagation of surface acoustic waves on the substrate depending on the normalized thickness of the interdigital electrode formed on the surface of the substrate, it is also possible to achieve a device having extremely excellent temperature stability.

Having described the present invention, it will now be apparent that many changes and modifications may be made to the above-described embodiments without departing from the spirit and the scope of the present invention.

What is claimed is:

1. A surface acoustic wave device comprising an inter-digital electrode on a surface of a substrate, wherein:

said substrate is made up of a langasite single crystal having the formula, $La_3Ga_5SiO_{14}$, and belonging to a point group 32, when a cut angle of said substrate cut out of the langasite single crystal and a direction of propagation of surface acoustic waves on said substrate are represented in terms of Euler's angles (φ, θ, ψ), φ, θ and ψ are found within areas represented by φ=−5 to 5°, θ=136 to 146°, and ψ=21 to 30°; and when ψ≦25.5, a relationship between a normalized thickness h/λ (%) where a thickness, h, of said interdigital electrode is normalized with a wavelength λ of a surface acoustic wave and said ψ (°) indicating the direction of propagation of the surface acoustic wave is given by $$-3.79\ (h/\lambda)+23.86 \leq \psi \leq -5.08\ (h/\lambda)+26.96$$

and when ψ>25.5, said relationship is given by $$4.39(h/\lambda)+24.30 \leq \psi \leq 3.54(h/\lambda)+27.17.$$

2. The surface acoustic wave device of claim 1, wherein said inter-digital electrode is formed by vacuum evaporation or sputtering using Al or Al alloys.

3. The surface acoustic wave device of claim 1, wherein said substrate is about 4 to 10 mm in a direction of propagation of surface acoustic waves and about 2 to 4 mm in a direction perpendicular thereto.

4. The surface acoustic wave device of claim 1, wherein values of φ, θ, and ψ are such that the temperature coefficient of frequency is within ±1 ppm /°C.

5. The surface acoustic wave device of claim 1, wherein values of φ, θ, and ψ are such that the coupling factor of $k^2$ of the substrate is at least 0.3%.

6. The surface acoustic wave device of claim 1, wherein in an area specified by said Euler's angles (φ, θ, ψ), a temperature dependence of frequency is in a form of a quadratic curve.

7. The surface acoustic wave device of claim 6, wherein a temperature corresponding to a peak of said quadratic curve, which is a temperature at which a change of center or resonance frequency is minimized, is in a range of 10° C. to 40° C.

8. The surface acoustic wave device of claim 6, which comprises inter-digital electrodes on both output and input sides of said substrate.

9. The surface acoustic wave device of claim 1, wherein said inter-digital electrode is a periodically striped electrode.

* * * * *